United States Patent [19]

Max

[11] 4,107,728
[45] Aug. 15, 1978

[54] PACKAGE FOR PUSH-PULL SEMICONDUCTOR DEVICES

[75] Inventor: Lee B. Max, Sunnyvale, Calif.

[73] Assignee: Varian Associates, Inc., Palo Alto, Calif.

[21] Appl. No.: 757,716

[22] Filed: Jan. 7, 1977

[51] Int. Cl.² .............. H01L 39/02; H01L 23/02; H01L 23/12
[52] U.S. Cl. .................. 357/80; 357/81; 357/74; 333/84 M
[58] Field of Search ............... 357/74, 80, 81; 333/84 M

[56] References Cited

U.S. PATENT DOCUMENTS

| | | | |
|---|---|---|---|
| 3,364,400 | 1/1968 | Granberry | 357/74 |
| 3,489,956 | 1/1970 | Yanai et al. | 357/74 |
| 3,555,375 | 1/1971 | Hilbers | 357/74 |
| 3,559,087 | 1/1971 | Goordman et al. | 357/74 |
| 3,713,006 | 1/1973 | Litty et al. | 357/74 |
| 3,801,938 | 4/1974 | Goshgarian | 357/74 |
| 3,869,677 | 3/1975 | Belohoubek et al. | 357/74 |
| 3,886,505 | 5/1975 | Jacobson | 357/74 |
| 3,908,185 | 9/1975 | Martin | 357/74 |
| 3,996,603 | 12/1976 | Smith | 357/74 |
| 3,999,142 | 12/1975 | Presser et al. | 357/80 |

Primary Examiner—Andrew J. James
Attorney, Agent, or Firm—Stanley Z. Cole; Robert K. Stoddard

[57] ABSTRACT

A semiconductor package for containing two individual devices such that they may be externally connected in a push-pull relationship. Two transistors, each having an input and output pad are formed on the same dielectric wafer, in a spaced relationship with each other and a ground plane so as to form two separate transmission line paths. The transistors are wired either in a grounded emitter or grounded base configuration. A shunt inductor is formed by a metallized strip or lead bond from the collector of one transistor to the collector of the other transistor. This inductor reduces the influence of the parasitic capacitance in the equivalent output circuit of the transistors. Since the collectors of both transistors are at the same DC level it is not necessary to include a DC blocking capacitor in series with the inductor. This increases the reliability and the reproducibility of the circuit because bonding wires necessary in prior devices to connect the blocking capacitor in series with the output inductance is not necessary. This packaging technique increases the output impedance, decreases the internal losses, and increases the bandwidth when wired as a push-pull circuit.

31 Claims, 5 Drawing Figures

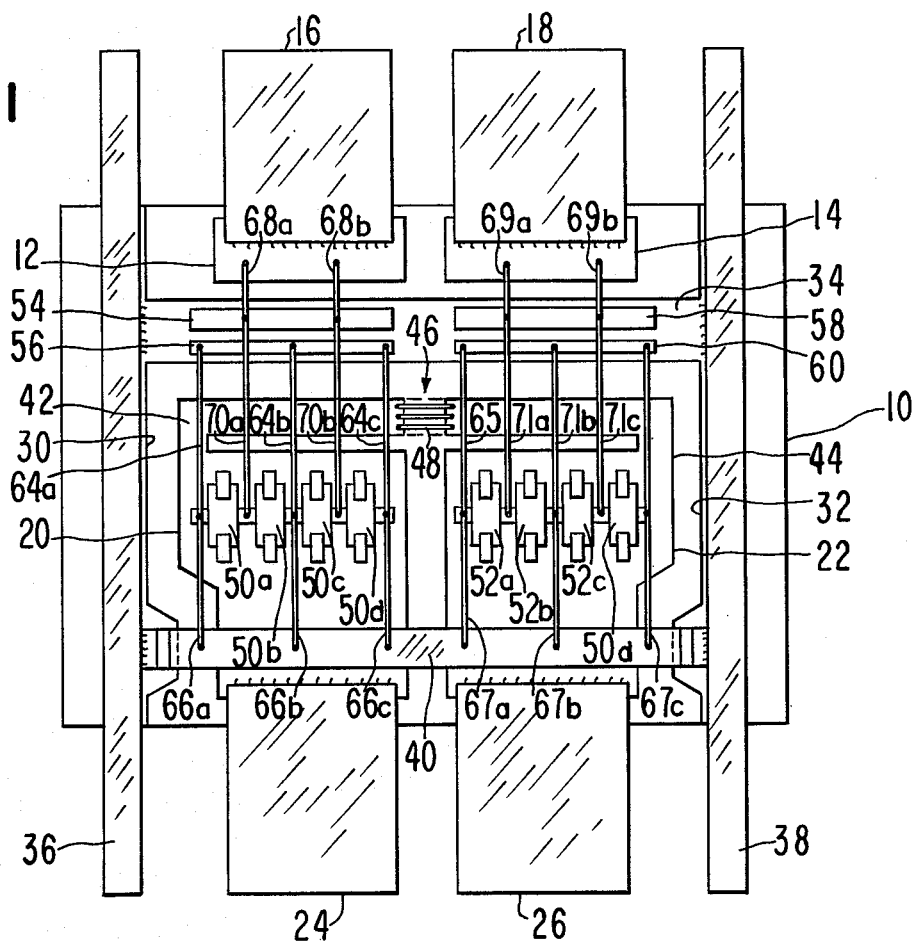
FIG.1
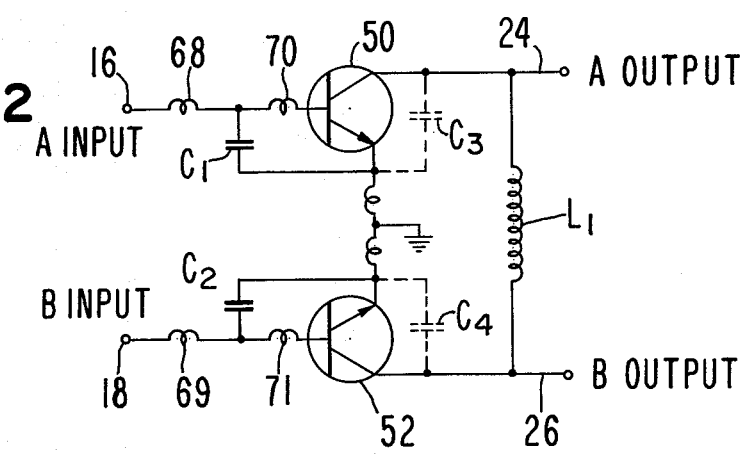
FIG.2
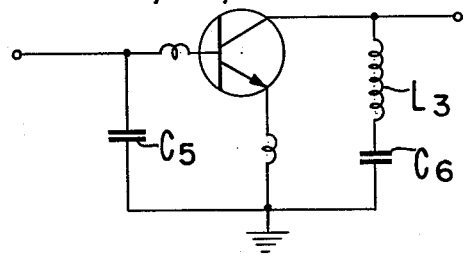
FIG.3 PRIOR ART (3,969,752 - MARTIN ET. AL.)

PACKAGE FOR PUSH-PULL SEMICONDUCTOR DEVICES

BACKGROUND OF THE INVENTION

1. Field of the Invention

The invention relates to semiconductor devices and more particularly to the packaging of two or more such devices within one package.

2. Description of the Prior Art

In high frequency transistor packages the inherent inductance and capacitance caused by bonding wires and metallic pads contribute to the bandwidth, power loss, and ultimate impedance matching capability of the device. In the past, these devices have been constructed by placing the input and output pads in a spaced relationship with a ground plane so that the circuit exhibits a transmission line characteristic with respect to the ground plane.

U.S. Pat. No. 3,713,006, which issued to Litty et al. on Jan. 23, 1973, is an example of a packaging technique for RF and microwave transistors which uses a number of transistors formed on a common die which are wired in parallel to provide a high power device. In order to achieve higher and higher power outputs, the approach has been to wire more and more transistors in parallel. The disadvantage of this is that the parasitic reactances associated with the transistor die and associated packaging leads cause the impedance levels to decrease and thus become an important part of the equivalent input and output circuit.

The bandwidth, internal power loss, input and output impedance levels, and impedance matching characteristics are all related to parasitic reactances created by the lead bonds within the package and the parasitic elements associated with the transistor die.

In U.S. Pat. No. 3,969,752, which issued to Martin et al. on July 13, 1976, a compensating circuit is formed by a shunt reactance which is equal to the shunt parasitic capacitance at the output of the transistor die. The shunt reactance resonates with the parasitic capacitance to thereby cancel out the reactance characteristic in the equivalent circuit. The reactance branch which includes a capacitance in series with an inductance is connected in parallel with the shunt die capacitance. The series capacitance is necessary in order to block the DC currents from the ground plane which otherwise would short out the transistor output through the inductance to ground. The inductance is provided by either a lumped tuning wire or a high impedance transmission line connected from the capacitance to the transistor die of the device. In either case, the prior circuit is necessarily complicated by the fact that bond wires must be used in order to connect the various elements of the circuit together. It is very difficult to always attain the same length of bond wire in a manufacturing process and therefore this circuit tends to be very difficult to reproduce in mass production. Furthermore, the series capacitor introduces further loss characteristics which degrade the efficiency of the transistor circuit. The necessity of having a capacitor introduces one more potential element to fail and thus decreases the overall reliability of the device.

SUMMARY OF THE INVENTION

It is a paramount object of this invention to provide an improved semiconductor package which has improved impedance levels, greater bandwidth, higher power, and simplified output impedance matching to external circuitry.

Briefly, the invention is a semiconductor package in which two or more semiconductor dies affixed to a common dielectric element are fabricated to facilitate forming a push-pull circuit configuration. Since the semiconductors operate in push-pull, the collectors of the semiconductors are always at substantially the same DC level. It is therefore unnecessary to provide a DC blocking capacitor in the output reactance circuit used to compensate for the parasitic output capacitance of the semiconductors.

The circuit has the advantage that the compensating reactance need only be comprised of an inductance connected across the two collectors of the push-pull semiconductors to thereby resonate with the parasitic output capacitance to minimize the effects thereof. This inductance may be formed of a single strip of metallic material between the collector pads, which material may be formed at the same time as and of the same material as the collector pads.

The circuit has the advantage that only a relatively small change in existing circuit packaging manufacturing techniques is necessary to practice the invention. Furthermore, these changes result in an overall reduction in the complexity of the circuit to achieve overall improved results.

The circuit has the advantage of achieving higher input and output impedance levels. More specifically, for a given amount of transistor die area the circuit achieves four times the input impedance and also four times the output impedance by using the push-pull approach of the invention as opposed to the conventional prior art parallel transistor approach.

The reduced series inductance because of the close proximity of the leads within the package and the increase in impedance levels achieves higher power levels and wider bandwidths with the packaging technique of the present invention.

The invention has the further advantage that the package allows DC connections for the base, emitter and collector to be made at points of RF ground. This makes the DC bypassing of the circuitry much less complicated. This means that the DC bias for the base can be connected at the point of RF ground on the transformer.

The foregoing and other objects, features and advantages of the invention will be apparent from the following more particular description of the preferred embodiments of the invention as illustrated in the accompanying drawings.

DESCRIPTION OF THE DRAWINGS

FIG. 1 is a plan view of a first embodiment of the present invention;

FIG. 2 is an equivalent circuit of the transistor package of FIG. 1 illustrating the parasitic reactances associated with the circuit and the output shunt inductance branch provided in accordance with one aspect of the present invention;

FIG. 3 is an equivalent circuit of a prior transistor package utilizing parallel transistors;

DETAILED DESCRIPTION OF THE INVENTION

Figure 4:
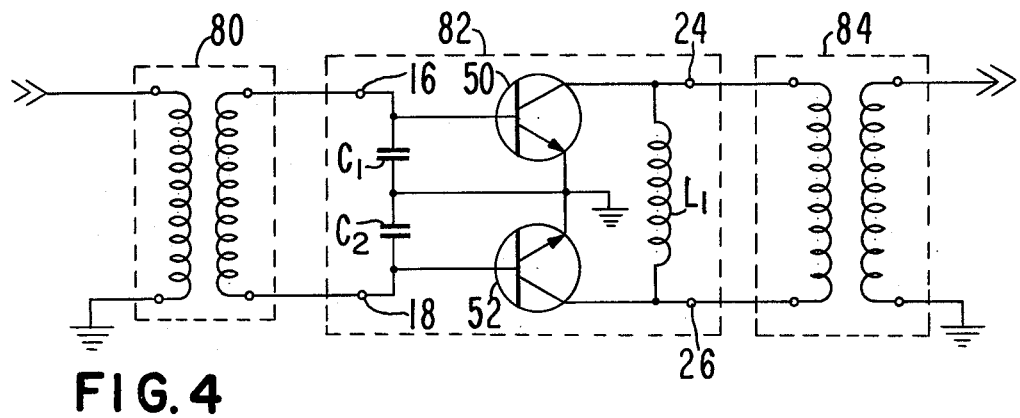
FIG. 4 is a schematic diagram of a typical push-pull amplifier circuit utilizing the transistor package of the present invention.

Referring now to FIG. 1 the transistor package is comprised of a ceramic wafer 10 upon which discrete metallized areas or pads are plated in accordance with known metallization techniques. These areas include a pair of input areas 12, 14. Input terminals 16, 18 are attached to the metallized input areas 12, 14, respectively.

A pair of output areas 20, 22 are also deposited on the ceramic wafer 10. The longitudinal axes of the pair of output areas are approximately coincident with the respective longitudinal axes of the pair of input areas 12, 14. Output leads 24, 26 are attached to the output areas 20, 22, respectively. A common ground plane is provided and in one embodiment is comprised of a pair of metallized ground areas 30, 32, deposited on the wafer 10, extending parallel to and on each side of the pairs of input and output areas.

While not essential to the present invention, a further metallized ground area 34 is deposited on the wafer, the area passing between the input and output areas and making electrical connection to the parallel ground areas 30 and 32.

Ground terminals 36, 38 extend parallel to and on each side of the pair of input terminals and the pair of output terminals and are affixed to the pair of ground areas 30, 32.

A bridge 40, passing over the pair of metallized output areas 20, 22, is affixed to each of the ground terminals 36, 38.

It is understood that the ground areas need not be metallized on the same wafer as the input and output pads. The ground plane may be, for example, a metal plate spaced from and parallel to the metallized areas, or any other arrangement that will result in the creation of transmission line characteristics at the operating frequency of the device.

The metallized output area 20 further includes a portion or strip of metallized area 42 extending between the first metallized input area 12 and the output area 20. This thin strip of metallized area extends to and forms a bridge with a second portion extending between the second input area 14 and the second output area 22. The first portion 42 and the second portion 44 are in alignment with each other with a space 46 therebetween such that the space can be bridged by inductance wires 48. In an alternative embodiment, the space 46 is connected as shown by the dotted lines such that the first and second portions 42 and 44 comprise a continuous metallized strip without bond wires. In either case, a parallel inductance is provided across the first and second output areas.

A transistor die 50, comprised of a plurality of individual transistor cells 50a-50d, is attached to the metallized area 20 to form a first transistor. The transistor die 50 is produced by well known methods and the body of the die constitutes the common collector of all the transistor cells 50a-50d such that the common collector region is placed in electrical contact with the output area 20.

A second transistor 52, comprised of individual cells 52a-52d is attached in a similar manner to the output area 22. Common emitter and base regions are formed within each cell 50a-50d and 52a-52d which in turn are interconnected so as to form a plurality of common base sites and common emitter sites in an alternating pattern along the center line of the transistor dies 50, 52.

A split capacitor is attached to the ground area 34 separating the input and output areas. A first capacitive element has a first plate 54 and a second plate 56. The first plate 54 of the first capacitor is connected to the input area 12 via leads 68 and the second plate 56 of the capacitor is attached to the emitter sites on the transistor die 50 via leads 64. The emitter sites are also connected to points on the bridge 40 by emitter lead bonds 66.

The first plate 54 of the first capacitor is also connected to the base sites on the transistor die 50 by lead bond wires 70.

A second capacitive element has a first plate 58 and a second plate 60. The first plate 58 of the second capacitor is connected to the input area 14 via leads 69 and the second plate 60 is attached to the emitter sites on the transistor die 52 via leads 71. The emitter sites are also connected to points on the bridge 40 by emitter lead bonds 67.

A common emitter configuration has been illustrated. It should be understood that the present invention is not limited to this configuration and is easily modified to a common base configuration by changing the lead bond connections appropriately.

Referring now to FIG. 2, a schematic diagram of the equivalent circuit of the transistor package shown in FIG. 1 is illustrated. The A input corresponds to the input terminal 16. The parasitic input inductances of the lead bond wires 68, 70 are illustrated by inductances 68, 70. The capacitance C1 is the input capacitance 54, 56 shown in FIG. 1. The parasitic capacitance C3 of transistor 50 is shown in phantom across the emitter and collector of transistor 50.

A similar circuit is shown for the transistor 52. The value of the input capacitors C1 and C2 is chosen so as to reduce the Q and increase the magnitude of the input impedance over the operating frequency band of the circuit.

The output inductance formed by the conductive strip 42, 44 of FIG. 1 is illustrated in the schematic diagram by inductance L1 which appears across the collectors of transistors 50, 52. The value of L1 is such that its reactance is equal to the combined capacitive reactance of capacitors C3 and C4 at the operating frequency. Thus the capacitance C3 and C4 and the inductance L1 will resonate thereby cancelling the effects of the total shunt capacitance contributed by C3 and C4.

It should be apparent from FIG. 2 that a DC blocking capacitor in series with the inductance L1 is not necessary because the collectors of transistors 50 and 52 are at substantially the same DC output level.

Referring now to FIG. 3, a schematic diagram of the prior art parallel transistor approach is shown. In this package, an inductor L3 is placed as close to the transistor die as possible to resonate out the parasitic capacitance C6 at the output. This inductance must be DC blocked from ground, otherwise it would cause a short across the output. Therefore a DC blocking capacitor C7 is wired in series with the inductance L3. By connecting two smaller transistors in a push-pull relationship in accordance with Applicant's invention, DC isolation is not necessary on the output because the collectors of the two transistors are at substantially the same DC potential. This eliminates the bond wires which were necessary to connect the series capacitor.

Therefore the reliability and reproducibility of the circuit is much greater because it is possible to form the inductance L1 by means of a continuous conductive strip metallized on the wafer. The actual value of the inductance L1 depends upon the values of C3 and C4 for the particular transistor fabricated and the frequency of operation. An approximate value would be an inductance reactance of 16 ohms at 300 megahertz, at a power level of about 125 watts.

The circuit of FIG. 2 wired in a push-pull circuit is shown in FIG. 4. This circuit has certain advantages over connecting the same transistors in a parallel arrangement as was done in the prior art. In order to wire two discrete transistors in parallel it is necessary to go through some printed inductance which reduces the high frequency performance by making the high frequency cut-off lower. The advantage of the push-pull arrangement of FIG. 4 is that higher input and higher output impedance levels are possible for a given amount of transistor die utilized. Furthermore greater power levels are possible than could be achieved by tying two single discrete devices in parallel. By placing the two transistors in the same package shorter connecting leads are made possible further improving the frequency response characteristics.

Figure 5:
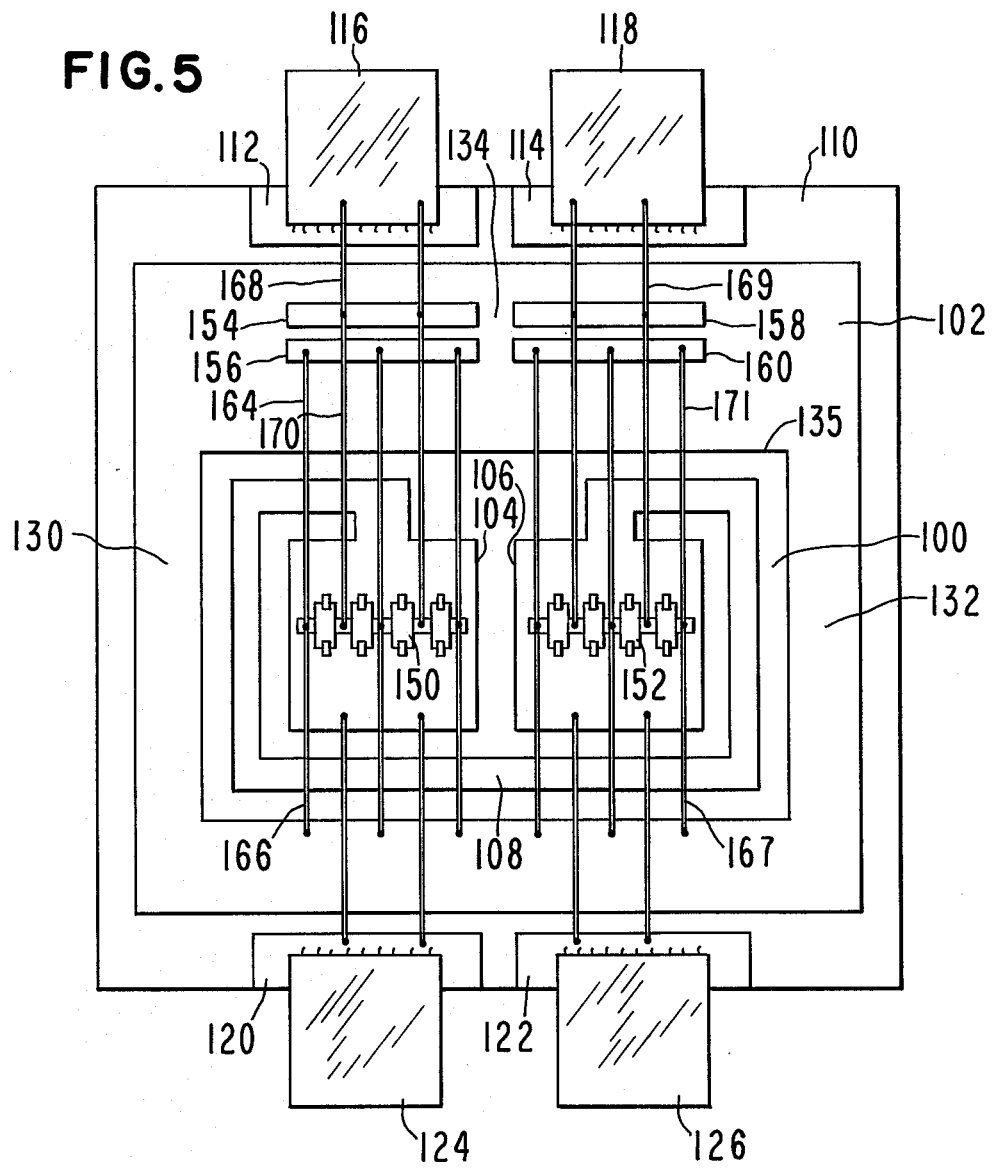
FIG. 5 is a plan view of a second embodiment of the invention.

Referring now to FIG. 5 a second embodiment of the invention is shown. In FIG. 5 the transistor package is comprised of two ceramic wafers providing two separate planes upon which discrete metallized areas or pads are plated. The lower ceramic wafer 100 has plated thereon a ground plane 102 which completely surrounds a pair of inner output areas 104, 106. The inner output areas 104, 106 are connected by a thin portion or strip of metallized area 108 extending between the first area 104 and the second area 106. This thin strip of metallized area comprises a parallel inductance across the first and second inner areas 104, 106.

An upper ceramic frame 110 is provided upon which a pair of input areas 112, 114 are plated. Input terminals 116 and 118 are attached to the metallized input areas 112, 114, respectively.

A pair of output areas 120, 122 are also deposited on the ceramic frame 110. Output leads 124, 126 are attached to the output areas 120, 122, respectively.

The common ground plane 102 is comprised of a pair of metallized ground areas generally designated by the numerals 130, 132, deposited on the lower ceramic wafer 100, extending parallel to and on each side of the inner areas 104, 106.

While not essential to the present invention, a further metallized ground area designated by the numeral 134, is deposited on the wafer, the area pssing between the input and inner output areas and making electrical connection to the parallel ground areas 130, 132. In the embodiment shown in FIG. 5, the ground areas just described are actually all interconnected to form a continuous ground plane 102 shaped in the form of a rectangle with an opening 135 at its center.

A transistor die 150, comprised of a plurality of individual transistor cells, is attached to the metallized inner area 120 to form a first transistor. The body of the die constitutes the common collector of all the transistor cells such that the common collector region is placed in electrical contact with the inner area 104.

A second transistor 152 is attached in a similar manner to the inner area 106. Emitter and base regions are formed within each cell which in turn are interconnected so as to form a plurality of common base sites and common emitter sites in an alternating pattern along the center line of the transistor dies 150, 152.

A split capacitor is attached to the ground area 134. A first capacitive element has a first plate 154 and a second plate 156. The first plate 154 is connected to the input area 112 via leads 168 and the second plate 156 is attached to the emitter sites on the transistor die 150 via leads 164. The emitter sites are also connected to points on the common ground plane via emitter lead bonds 166. This results in a grounded emitter configuration. The first plate 154 of the first capacitor is also connected to the base sites on the transistor die by lead bond wires 170.

A second capacitive element has a first plate 158 and a second plate 160. The first plate 158 of the second capacitor is connected to the input area 114 via leads 169 and the second plate 160 is attached to the emitter sites on the transistor die 152 via leads 171. The emitter sites are also connected to points on the common ground plane by emitter lead bonds 167.

A common base configuration has been illustrated. It should be understood that the described embodiment of the invention is not limited to this configuration and is easily modified to a common emitter configuration by changing the lead bond connections appropriately.

The equivalent circuit of the transistor package shown in FIG. 5 is identical to that shown in FIG. 2 with the exception that the base and emitter connections are reversed to thereby provide a common grounded base configuration.

The two embodiments of the invention have been described with respect to transistor dies having three active areas, however, it should be understood that the invention can be practiced utilizing any semiconductor devices and is not limited to devices having three active areas.

Furthermore, the embodiments have shown the input and output areas plated on the same wafer. It should be understood that the invention can be practiced by creating a multilayered structure in which the input, output and ground areas are all on different planes, or some on the same plane or all on the same plane.

While the invention has been particularly shown and described with reference to preferred embodiments thereof, it will be understood by those skilled in the art that various changes in form and details may be made therein without departing from the spirit and scope of the invention.

What is claimed is:

1. A package for semiconductor devices comprising:
  a first dielectric member;
  a pair of mutually electrically isolated input areas on said first member comprised of a first conductive input area and a second conductive input area adjacent said first input area;
  a pair of mutually electrically isolated output areas on said first member comprised of a first conductive output area and a second conductive output area adjacent said first output area:
  a second dielectric member;
  a common ground plane on said second member substantially parallel to said pairs of input and output areas such that each of said first and second input areas and each of said first and second output areas cooperate with said ground plane to form a structure for packaging first and second active semiconductor devices to thereby provide first and second discrete paths for the transfer of energy at high frequency from input to output over each of said paths and further including first and second active semiconductor devices connected, respectively, between said first input area and said first output area, and between said second input area and said second output area.

2. The combination in accordance with claim 1 further comprising a pair of inner output areas on said second member comprised of a first conductive inner output area and a second conductive inner output area adjacent said first inner output area and wherein said common ground plane is comprised of a pair of conductive ground areas on said second member extending parallel to and on each side of said pair of inner output areas 3. The combination in accordance with claim 2 further comprising a first further conductive ground area on said second element passing between said input and inner output areas and electrically connected to said pair of metallized ground areas.

4. The combination in accordance with claim 2 further comprising a second further conductive ground area passing between said pair of inner output areas and said output areas and making electrical contact with said pair of conductive ground areas.

5. The combination in accordance with claim 4 further comprising:
   a first die of semiconductor material having at least first, second, and third active regions therein forming a first transistor;
   a second die of semiconductor material having at least first, second, and third active regions therein forming a second transistor;
   means electrically connecting said first die to said first inner output area such that the first active region thereof makes contact with said first inner output area;
   means electrically connecting said second die to said second inner output area such that said first active region thereof makes contact with said second inner output area;
   a first electrical connection between said second further conductive ground area and said third active region of said first transistor;
   a second electrical connection between said second further conductive ground area and said third active region of said second transistor;
   a third electrical connection between said first input area and said second active region of said first transistor; and
   a fourth electrical connection between said second input area and said second active region of said second transistor.

6. The combination in accordance with claim 5 further comprising a fifth electrical connection between said first inner output area and said first output area; and
   a sixth electrical connection between said second inner output area and said second output area.

7. The device of claim 5 wherein the numbers of said first, second and third active regions of said semiconductor dies are greater than one respectively.

8. The device of claim 5 wherein said first, second and third active regions of said semiconductor dies are transistor collector, base and emitter regions, respectively.

9. The device of claim 5 wherein said first, second and third active regions of said semiconductor dies are transistor collector, emitter and base regions, respectively.

10. The combination in accordance with claim 5 further comprising:
    a first further conductive ground area on said second element passing between said input and inner output areas and electrically connected to said ground area.

11. The combination in accordance with claim 10 further comprising:
    a first capacitive element on said first further ground area, said element having first and second plates, and wherein said third electrical connection includes means for connecting said first plate to said first input area and means for connecting said second plate to said second active region of said first die.

12. The combination in accordance with claim 11 further comprising:
    a second capacitive element on said first further ground area, said element having third and fourth plates, and wherein said fourth electrical connection includes means for connecting said third plate to said second input area and means for connecting said fourth plate to said second active region of said second die.

13. The combination in accordance with claim 1 wherein said pair of inner output areas are connected by an inductance.

14. The combination in accordance with claim 13 wherein said inductance is a conductive strip extending from said first inner output area to said second inner output area.

15. The combination in accordance with claim 13 wherein said conductive strip is located on said second dielectric element.

16. The combination in accordance with claim 1 wherein said pair of inner output areas further comprises:
    a portion of conductive area extending from said first conductive output area defining a thin strip of conductive area electrically connected to said first inner output area; and
    a second portion extending from said second inner output area, said first and second portions being in alignment with each other with a space therebetween such that said space can be bridged by an inductance wire bonded to said first and second portions to thereby provide a parallel inductance across said first and second inner output areas.

17. A common package for semiconductor devices comprising:
    a dielectric member;
    a pair of input areas on said member comprised of a first conductive input area and a second conductive input area adjacent said first input area;
    a pair of output areas on said member comprised of a first conductive output area and a second conductive output area adjacent said first output area;
    a common ground area adjacent to and substantially parallel to said pairs of input and output areas,
    whereby each of said first and second input areas and each of said first and second output areas are in such a spatial relationship with said ground plane so as to form a portion of an electrical circuit including said semiconductor devices and further including first and second active semiconductor devices connected, respectively, between said first input area and said first output area, and between said second input area and said second output area, each of said active semiconductor devices defining a discrete path for the transfer of high frequency energy from input to output.

18. The combination in accordance with claim 17 wherein said common ground area is comprised of a pair of metallized ground area portions on said member extending parallel to and on each side of said pairs of input and output areas.

19. The combination in accordance with claim 18 further comprising a further metallized ground area passing between said input and output areas, said ground area portion being electrically connected to said pair of metallized ground area portions.

20. The combination in accordance with claim 18 further comprising a conductive bridge passing over said pair of output areas and making electrical contact with said pair of metallized ground area portions.

21. The combination in accordance with claim 20 further comprising:
a first die of semiconductor material having at least first, second, and third active regions therein forming a first transistor;
a second die of semiconductor material having at least first, second, and third active regions therein forming a second transistor;
means electrically connecting said first die to said first output area such that the first active region thereof makes contact with said first output area;
means electrically connecting said second die to said second output area such that said first active region thereof makes contact with said second output area;
a first electrical connection between said bridge and said third active region of said first transistor
a second electrical connection between said bridge and said third active region of said second transistor;
a third electrical connection between said first input area and said second active region of said first transistor; and
a fourth electrical connection between said second input area and said second active region of said second transistor.

22. The device of claim 21 wherein the numbers of said first, second and third active regions of said semiconductor dies are greater than one respectively.

23. The device of claim 21 wherein said first, second and third active regions of said semiconductor dies are transistor collector, base and emitter regions, respectively.

24. The device of claim 21 wherein said first, second and third active regions of said semiconductor dies are transistor collector, emitter and base regions, respectively.

25. The combination in accordance with claim 21 further comprising:
a further conductive ground area portion passing between said input and output areas, said further ground area portion being electrically connected to said common ground area.

26. The combination in accordance with claim 25 further comprising:
a first capacitive element on said further ground area portion, said element having first and second plates, and wherein said third electrical connection includes means for connecting said first plate to said first input area and means for connecting said second plate to said second active region of said first die.

27. The combination in accordance with claim 26 further comprising:
a second capacitive element on said further ground area portion, said element having third and fourth plates, and wherein said fourth electrical connection includes means for connecting said third plate to said second input area and means for connecting said fourth plate to said second active region of said second die.

28. The combination in accordance with claim 17 wherein said pair of output areas are connected by an inductance.

29. The combination in accordance with claim 28 wherein said inductance is a conductive strip extending from said first output area to said second output area.

30. The combination in accordance with claim 28 wherein said conductive strip is located between said pair of input areas and said pair of output areas.

31. The combination in accordance with claim 17 wherein said pair of output areas further comprises:
a first portion of metallized area extending from said first output area defining a thin strip of metallized area electrically connected to said first output area; and
a second portion extending from said second output area, said first and second portions being in alignment with each other with a space therebetween such that said space can be bridged by an inductance wire bonded to said first and second portions to thereby provide a parallel inductance across said first and second output areas.

* * * * *